(12) United States Patent
Sugano (10) Patent No.: US 6,437,589 B1
(45) Date of Patent: Aug. 20, 2002

(54) SEMICONDUCTOR DEVICE TEST CIRCUIT

(75) Inventor: Hiroaki Sugano, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/628,166

(22) Filed: Jul. 28, 2000

(30) Foreign Application Priority Data

Nov. 10, 1999 (JP) .......................................... 11-319371

(51) Int. Cl.$^7$ .............................................. G01R 31/02
(52) U.S. Cl. ..................... 324/763; 324/73.1; 324/76.82
(58) Field of Search ................................ 324/760, 763, 324/73.1, 73 R, 765, 719, 76.82, 619; 348/372; 714/726; 377/73, 75

(56) References Cited

U.S. PATENT DOCUMENTS 5,737,341 A * 4/1998 Hosokawa ................... 714/726
5,881,067 A * 3/1999 Narayanan ................... 714/726
6,243,137 B1 * 6/2001 Aihara ......................... 348/372

FOREIGN PATENT DOCUMENTS

JP          04-195347          7/1992

* cited by examiner

Primary Examiner—Michael J. Sherry
Assistant Examiner—Trung Nguyen
(74) Attorney, Agent, or Firm—Armstrong, Westerman & Hattori, LLP (57) ABSTRACT

A system circuit constituting a semiconductor device (LSI) incorporates a test circuit for detecting a fault in the device. The test circuit comprises a plurality of flip-flop circuits. In this invention, a period adjusting flip-flop is added to the final stage of the test circuit. In accordance therewith, the test (SCAN operation) period can be easily adjusted.

2 Claims, 7 Drawing Sheets

SEMICONDUCTOR DEVICE TEST CIRCUIT

BACKGROUND OF THE INVENTION

1. Field of the Invention

The present invention relates to a semiconductor device test circuit for detecting a fault in a semiconductor device, and more particularly, to a semiconductor device test comprising flip-flop circuits each including a racing prevention circuit.

2. Description of the Related Art

Semiconductor device process technology has been improved in recent years, and the scale of the system circuit constituting a semiconductor device (LSI) has been enlarged. In accordance therewith, it has become necessary to incorporate in a system circuit a test circuit (SCAN circuit) for detecting faults in a developed system circuit.

Figure 4:
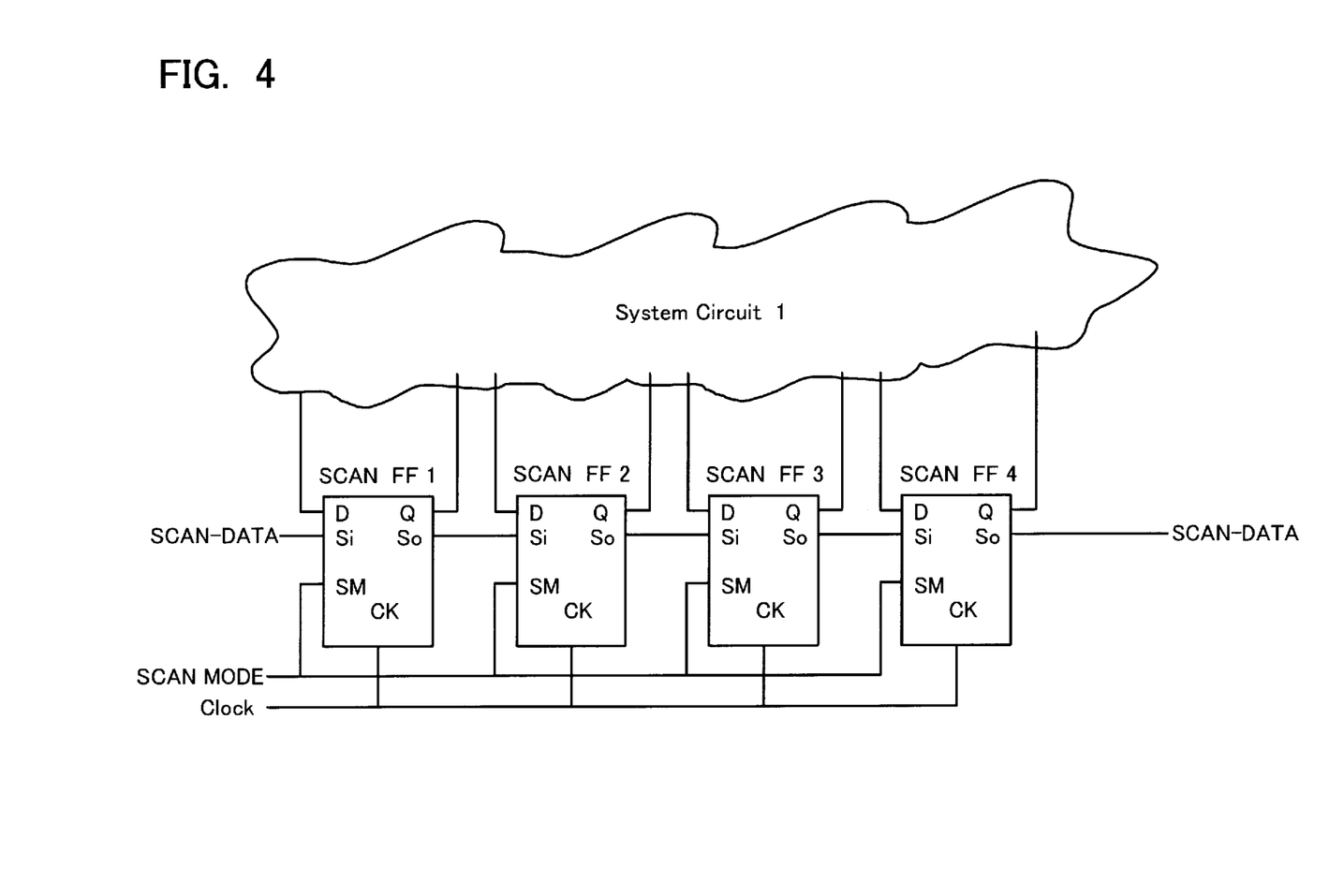
FIG. 4 is a diagram showing a system circuit having a SCAN circuit.

FIG. 4 is a diagram showing a system circuit having a SCAN circuit. In FIG. 4, a SCAN circuit has a structure, in which a plurality of test flip-flop circuits SCAN-FF (In FIG. 4, there are 4 SCAN-FF, that is, SCAN-FF 1, SCAN-FF 2, SCAN-FF 3, and SCAN-FF 4) connected in a chain. That is, the SCAN-out terminal of each SCAN-FF is connected to the SCAN-in terminal of the next SCAN-FF. Further, as is clear from the figure, each SCAN-FF constituting the SCAN circuit is a circuit having a D flip-flop, and is part of system circuit 1. Therefore, in the ordinary operation of system circuit 1, a system signal is inputted at the D terminal of each SCAN-FF, and a system signal is outputted from the Q terminal.

Figure 5:
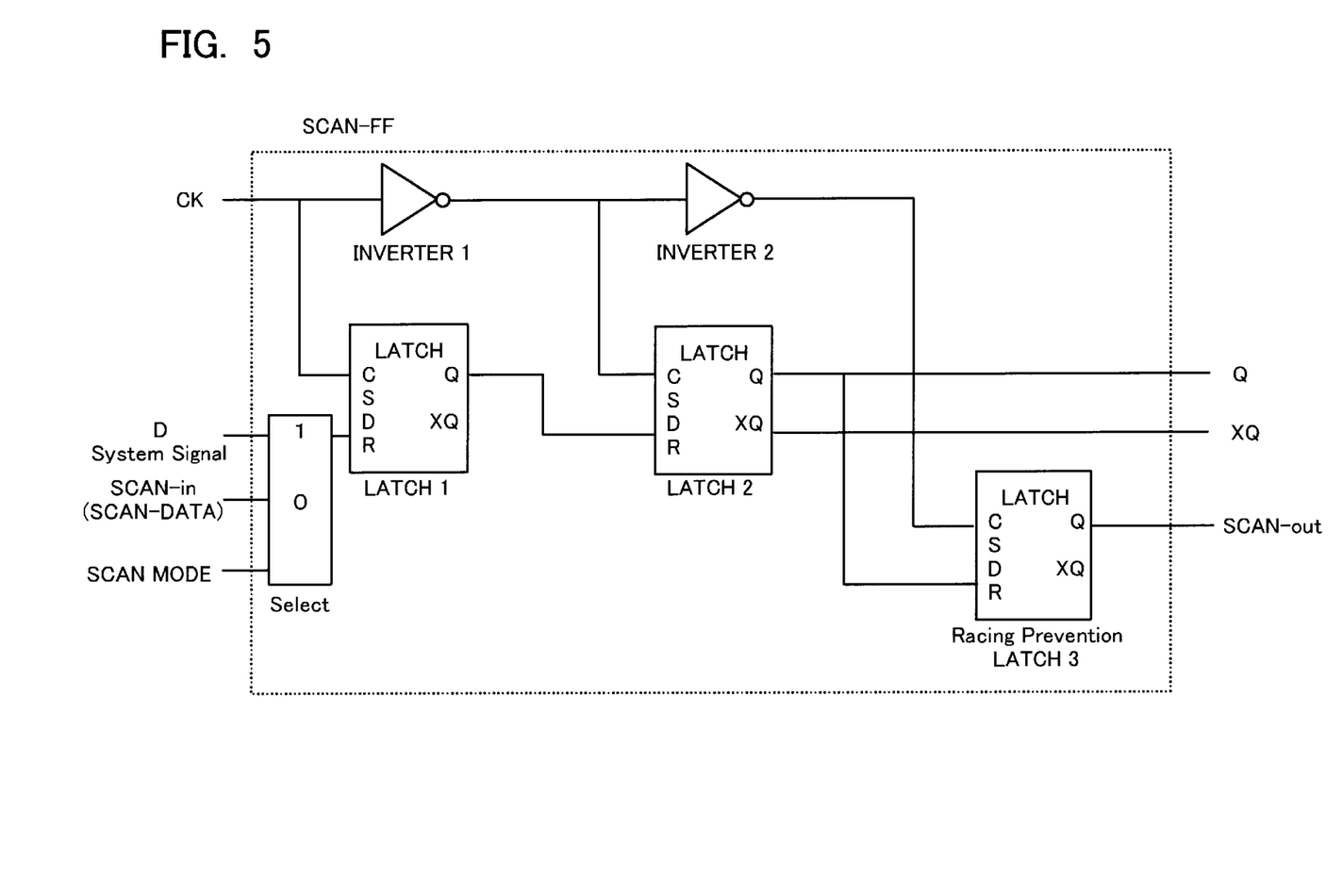
FIG. 5 is a diagram showing an example of a constitution of a SCAN-FF.

FIG. 5 is an example of the constitution of a SCAN-FF. The SCAN-FF shown in the figure is a circuit called a racing prevention circuit-equipped MUX-D-type SCAN-FF. In FIG. 5, the portion enclosed by a dotted line (portion comprising 2 latch circuits (LATCH1, LATCH2) and an inverter (INVERTER1)) constitutes a D flip-flop. And, a selector is connected to the D terminal of LATCH1. The selector supplies to the D terminal of LATCH1 either a system signal from the system circuit, or a SCAN-DATA signal, which is a test signal, via a SCAN-MODE signal inputted at a SCAN-MODE terminal (SM terminal). For example, when the SCAN-MODE signal is High ('1'), the selector selects a system signal from the SCAN-FF D terminal, and when the SCAN-MODE signal is Low ('0'), the selector selects a SCAN-DATA signal from the SCAN-FF SCAN-in terminal.

Furthermore, the SCAN-FF shown in the figure has a latch circuit (LATCH3) for preventing racing. Racing refers to a phenomenon, in which circuit operation becomes unstable due to a deviation between the clock timing inputted to each SCAN-FF, and the timing of a SCAN-DATA signal inputted at an Si terminal. A clock signal is supplied from an inverter (INVERTER2) to LATCH3, and Q output of LATCH2 is inputted at the D terminal of LATCH3. The Q terminal of LATCH3 constitutes the SCAN-out terminal for the SCAN-FF.

Figure 6:
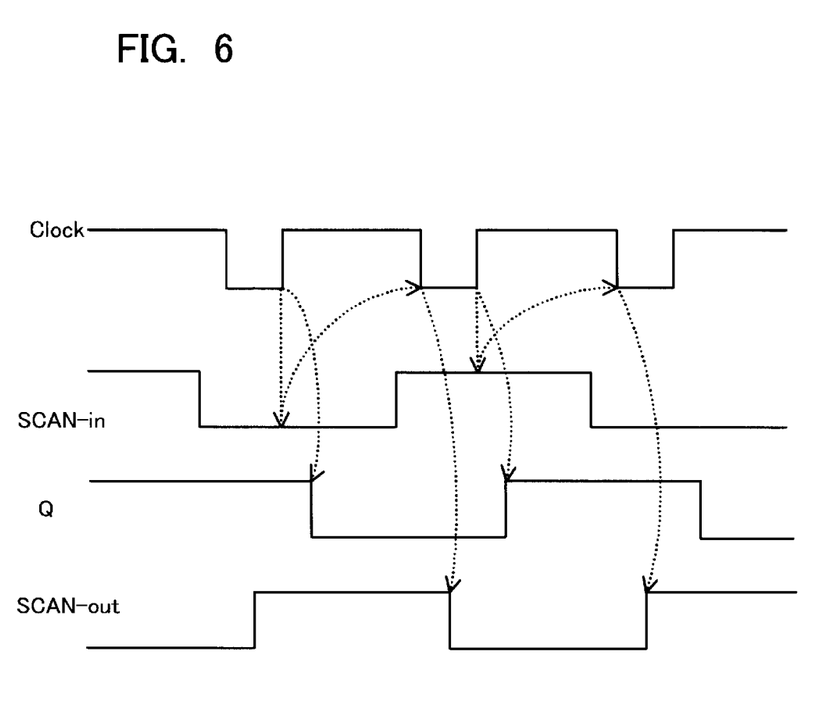
FIG. 6 is a timing chart of a SCAN-FF.

FIG. 6 is a timing chart of a SCAN-FF. As shown in FIG. 6, the SCAN-FF latches the SCAN-in terminal state at the rising edge of the clock signal, and outputs this latched state from the Q terminal. Furthermore, the latched state is outputted from the SCAN-out terminal at the falling edge of the next clock signal.

A case in which a SCAN-DATA signal for a test is selected in a SCAN circuit, in which SCAN-FF are connected in a chain like this, will be explained hereinbelow.

Figure 7:
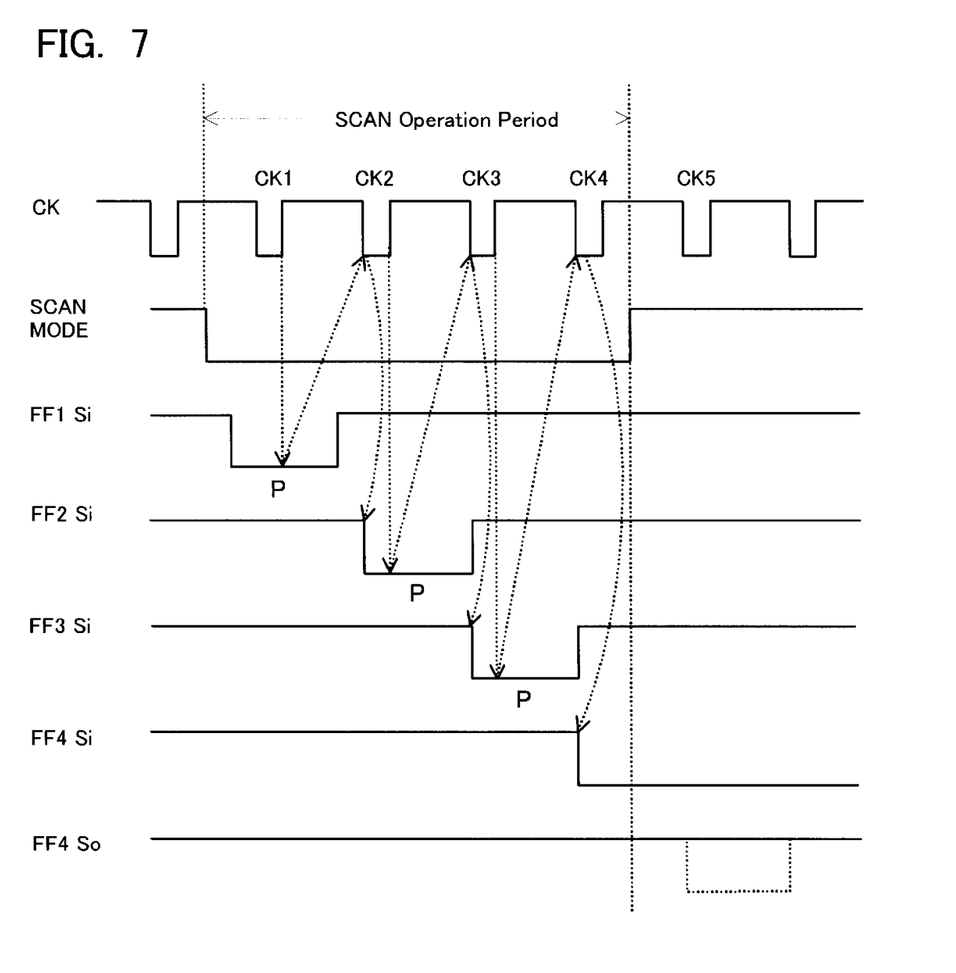
FIG. 7 is a timing chart of the SCAN circuit of FIG. 4.

FIG. 7 is a timing chart of a case in which there is selected a SCAN-DATA signal from the SCAN-in terminal in the SCAN circuit of FIG. 4. In FIG. 7, when test is selected, a SCAN-MODE signal is driven Low, and a SCAN operation (test) commences. At this time, this SCAN operation period is set to clock periods of the number of flip-flops comprising the SCAN circuit. Therefore, when a test is implemented for the SCAN circuit shown in FIG. 4, the SCAN operation period constitutes 4 clock periods (Hereinafter, for the sake of explanation, the 4 clocks in the SCAN operation period are referred to in order as clocks CK1, CK2, CK3, CK4.).

When a SCAN-DATA signal is selected by a SCAN-MODE signal, first, a SCAN-DATA signal (pulse P) is inputted from the SCAN-in terminal (hereinafter referred to as Si terminal) of SCAN-FF1. SCAN-FF1 latches the state of SCAN-DATA signal P (L state in the figure) at the rising edge of clock CK1, and outputs the latched state from the SCAN-out terminal (hereinafter referred to as So terminal) at the falling edge of the next clock CK2. The outputted signal from the So terminal of SCAN-FF1 is inputted at the Si terminal of SCAN-FF2 at practically the same time as it is outputted. And then, SCAN-FF2, similar to SCAN-FF1, latches the state of SCAN-DATA signal P at the rising edge of clock CK2, and outputs the latched state from the So terminal at the falling edge of the next clock CK3.

Similarly, SCAN-FF3 latches the state inputted at the Si terminal thereof at the rising edge of clock CK3, and outputs the latched state from the So terminal at the falling edge of the next clock CK4. Furthermore, SCAN-FF4 latches the state inputted at the Si terminal thereof at the falling edge of clock CK4.

At this time, because the SCAN operation period ends after clock CK4 rises and before the next clock CK5 falls, the SCAN-DATA signal outputted from the So terminal of SCAN-FF4 cannot be acquired during the SCAN operation period. The problem was, by using the latch circuit (LATCH3) for preventing racing in this manner, the SCAN-FF could not detect the SCAN-DATA signal outputted from the So terminal of the final stage SCAN-FF (SCAN-FF4 in FIG. 4) during the SCAN operation period since the signal inputted from the Si terminal generated a delay of approximately 1 clock cycle until outputted from the So terminal.

Consequently, in the past, it was necessary to change the number of clocks of the SCAN operation period at the system circuit design CAD tool (software) side. However, as explained hereinabove, the SCAN operation period is set beforehand in the CAD tool to clock periods of the number of SCAN-FF, and changing the program in the CAD tool is not easy.

SUMMARY OF THE INVENTION

Therefore, an object of the present invention is to provide a semiconductor device test circuit that enables the SCAN operation period to be adjusted by simpler means.

To achieve the above-mentioned object, in the present invention, a period adjusting flip-flop is added to the final stage of a SCAN circuit incorporated in a system circuit constituting a semiconductor device (LSI). In accordance therewith, the SCAN operation period can be easily adjusted.

For example, the constitution of the present invention for achieving the above-mentioned object is a semiconductor device test circuit for testing a system circuit constituted on a semiconductor device, said semiconductor device test circuit comprising:

n number of test flip-flop circuits, each including a racing prevention circuit; and an additional flip-flop circuit, wherein said test flip-flop circuits constitute a portion of said system circuit, a test signal output terminal of a $k^{th}$ (k is 1 through n−1) test flip-flop circuit is connected to a test signal input terminal of the $(k+1)^{th}$ test flip-flop terminal, and the test signal outputted from the $n^{th}$ test flip-flop circuit is inputted to said additional flip-flop circuit.

In a constitution such as this, by outputting a test signal from the Q terminal of the additional flip-flop circuit, it is possible for the test signal to be outputted within the SCAN operation period.

DESCRIPTION OF THE PREFERRED EMBODIMENTS

Aspects of the embodiment of the present invention is explained hereinbelow. However, the technical scope of the present invention is not limited to these aspects of the embodiment.

Figure 1:
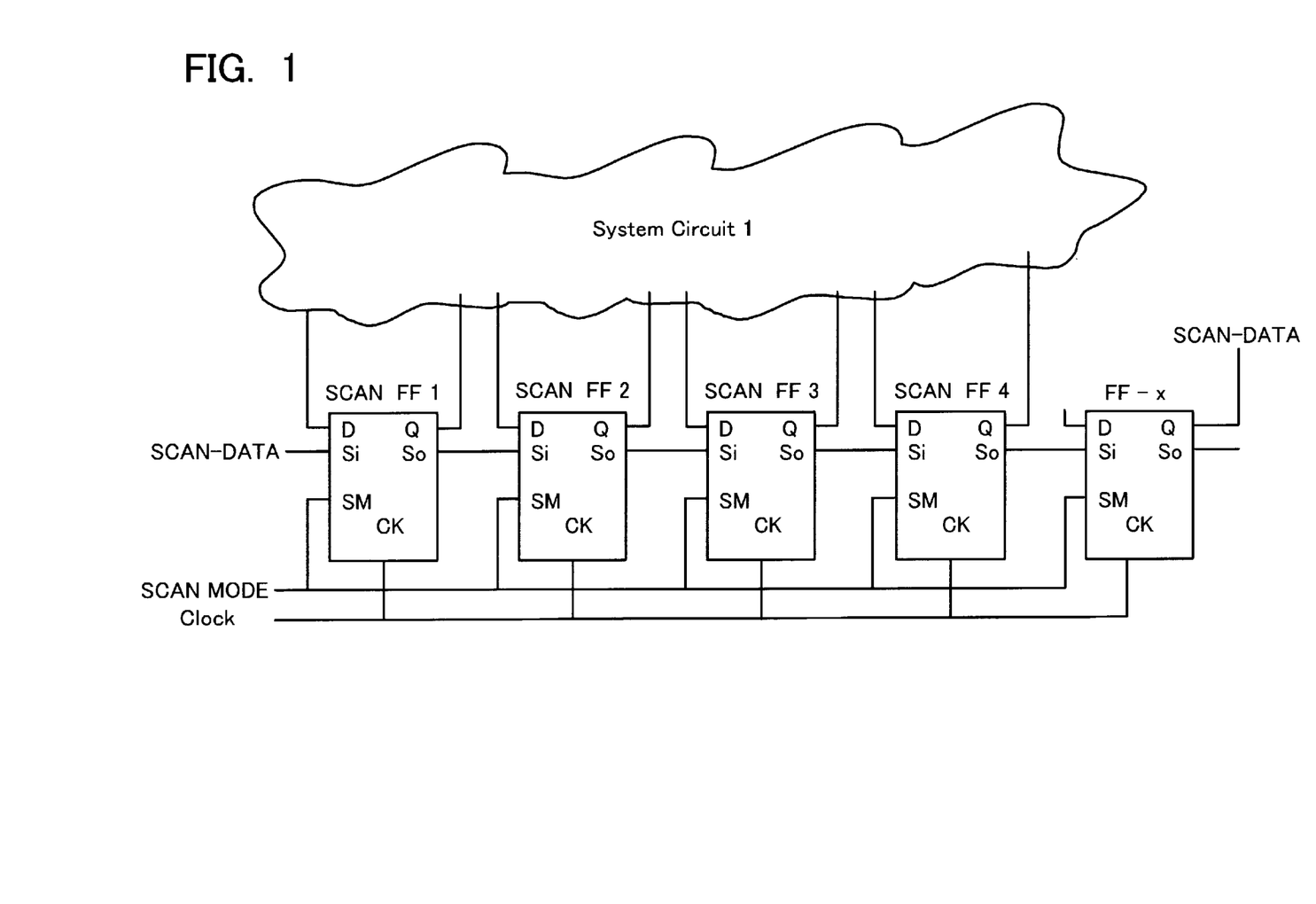
FIG. 1 is a diagram showing a semiconductor device test circuit (SCAN circuit) in an aspect of the embodiment of the present invention.

FIG. 1 is a diagram showing a semiconductor device test circuit (SCAN circuit) in an aspect of the embodiment of the present invention. A SCAN (test) circuit in an aspect of the embodiment of the present invention comprises period adjusting flip-flop circuit FF-x, in addition to a plurality of test flip-flop circuits SCAN-FF, which constitute a portion of a system circuit 1. The FF-x is connected behind the last stage SCAN-FF. The circuit constitution of the FF-x, for example, is the same as the circuit constitution of the SCAN-FF shown in the above-mentioned FIG. 5. That is, FF-x comprises a D flip-flop, by which a system signal and a SCAN-DATA signal are selectively inputted, and a latch circuit for preventing racing. Further, FF-x can have a constitution, which eliminates the selector from the circuit constitution of the constitution of FIG. 5. This is because, since FF-x does not constitute a portion of a system circuit, a system signal from a system circuit is not inputted. Furthermore, FF-x can be a constitution, which eliminates the racing prevention latch circuit from the circuit constitution of FIG. 5. This is because there is no need to take racing into consideration since FF-x is the final stage flip-flop circuit of a SCAN circuit, and since the output signal thereof is not inputted to the next flip-flop circuit. That is, FF-x is a circuit comprising at the least 1 D flip-flop. And, as will be explained hereinbelow, in this aspect of the embodiment of the present invention, a SCAN-DATA signal is outputted from the FF-x Q terminal. Since this period adjusting FF (FF-x) is a dummy flip-flop, which does not constitute a portion of system circuit 1, it becomes possible to use the Q terminal thereof for outputting a SCAN-DATA signal.

Figure 2:
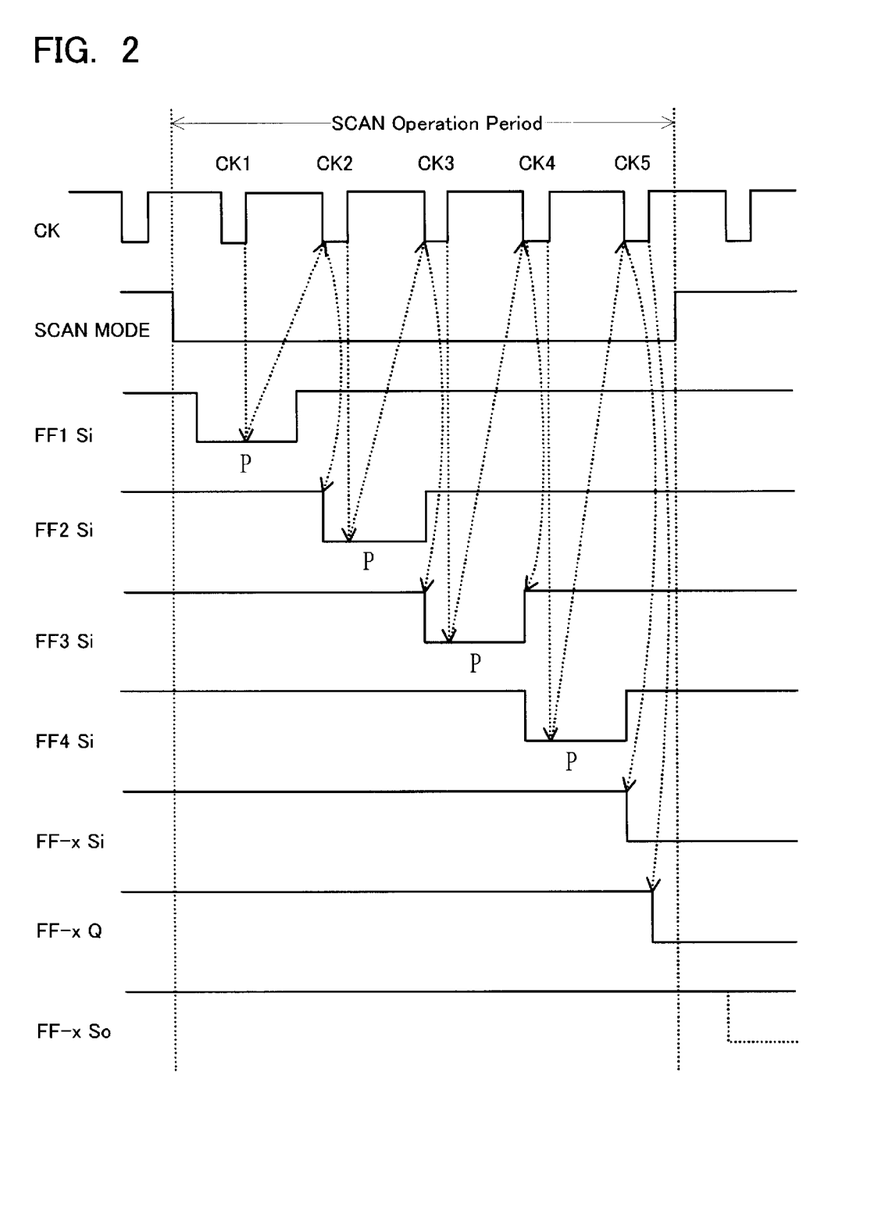
FIG. 2 is a timing chart of a SCAN circuit in the embodiment of the present invention.

FIG. 2 is a timing chart of a SCAN circuit in the embodiment of the present invention. In FIG. 2, the operation from SCAN-FF1 to SCAN-FF4 is the same as the above-mentioned FIG. 7. That is, when test is selected, a SCAN-MODE signal is driven Low, and a SCAN operation commences. At this time, the SCAN operation period thereof is set at clock periods of the number of flip-flops comprising the SCAN circuit. In this aspect of the embodiment, since an FF-x is added, when a SCAN operation (test) is implemented in the SCAN circuit shown in FIG. 1, the SCAN operation period constitutes 5 clock periods (Hereinbelow, for the sake of explanation, the 5 clocks in the SCAN operation period are referred to in order as clocks CK1, CK2, CK3, CK4, CK5.).

In this manner, in this aspect of the embodiment of the present invention, since the SCAN circuit has a period adjusting flip-flop FFx in addition to SCAN-FF incorporated into system circuit 1, the SCAN operation period is set by clock periods of the number of SCAN-FF (4 in FIG. 1) plus 1. In accordance therewith, a SCAN-DATA signal can be outputted within the SCAN operation period.

When a SCAN-DATA signal is selected by a SCAN-MODE signal, first, a SCAN-DATA signal (pulse P) is inputted from the Si terminal of SCAN-FF1. SCAN-FF1 latches the state of SCAN-DATA signal P (L state in the figure) at the rising edge of clock CK1, and outputs the latched state from the So terminal at the falling edge of the next clock CK2. The outputted signal from the So terminal of SCAN-FF1 is inputted at the Si terminal of SCAN-FF2 at practically the same time as it is outputted. And then, SCAN-FF2, similar to SCAN-FF1, latches the state of SCAN-DATA signal P at the rising edge of clock CK2, and outputs the latched state from the So terminal at the falling edge of the next clock CK3.

Similarly, SCAN-FF3, SCAN-FF4 also latch the state inputted at the Si terminals thereof at the rising edge of a clock, and output the latched state from the So terminal at the falling edge of the next clock. Therefore, SCAN-FF3 latches an L state of SCAN-DATA signal P at the rising edge of clock CK3. And then, SCAN-FF3 outputs an L state from the So terminal at the falling edge of the next clock CK4. Furthermore, SCAN-FF4 latches an L state at the rising edge of clock CK4, and outputs an L state from the So terminal at the falling edge of the next clock CK5. The outputted signal from the So terminal of SCAN-FF4 is subsequently inputted at the Si terminal of FF-x.

And then, FF-x outputs an L state from the Q terminal thereof at the rising edge of clock CK5. The Q output of FF-x, as shown in FIG. 6, is when the clock rises. Further, as explained hereinabove, since FF-x is not a portion of system circuit 1, the Q terminal thereof can be used as a test terminal. As shown in the figure, because the SCAN operation period ends after clock CK5 rises, FF-x can output from the Q terminal thereof, within the SCAN operation period, the SCAN-DATA signal, which SCAN-FF1 latched at the falling edge of clock CK1. Therefore, since Q output changes during the SCAN operation period, when Q output is measured by a prescribed strobe timing which is synchronized to a clock cycle, it is possible to detect the Q output change, that is, the SCAN-DATA signal. Furthermore, since the SCAN operation period ends after clock CK5 rises, a SCAN-DATA signal is not outputted from the So terminal of FF-x.

Figure 3:
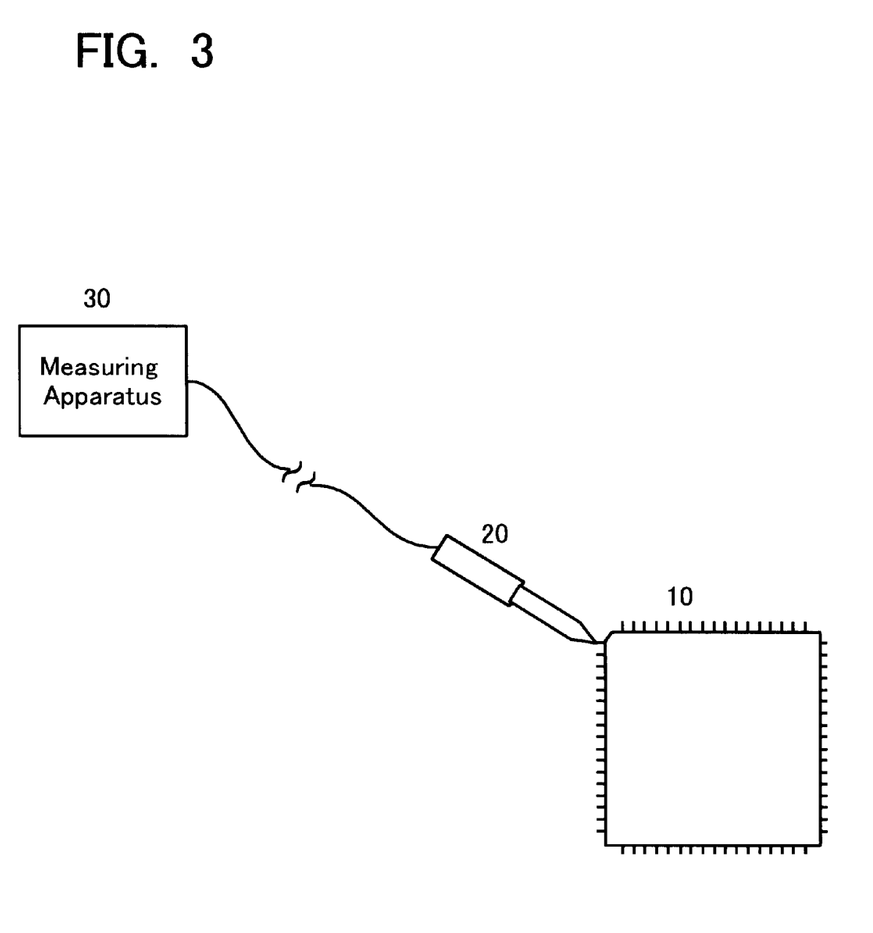
FIG. 3 is a diagram showing a semiconductor device (LSI) test method.

FIG. 3 is a diagram showing a semiconductor device test method. A system circuit is constituted on the inside of semiconductor device 10. And then, a terminal for outputting a signal, which is fetched to the outside from the system circuit, is connected to a plurality of LSI terminals provided on the outside of the semiconductor device (LSI). Therefore, the Q terminal of the period adjusting flip-flop FF-x is also connected to one of a plurality of LSI terminals.

And then, an FF-x Q output is detected by causing a tester probe 20 to come in contact with the LSI terminal to which the FF-x Q terminal is connected, and a measuring apparatus 30 measuring a signal from the tester probe.

Further, a system circuit incorporated into a semiconductor device 10 is generally constituted, for example, from between around 10,000–1,000,000 basic cells (bc). And then, for example, a flip-flop (comprising SCAN-FF and FF-x) is ordinarily comprised from around 10–15 basic cells (bc).

In the above-described aspect of the embodiment of the present invention, since only one flip-flop is added to a system circuit, a SCAN operation period can be adjusted without consuming basic cells to the extent of having an effect on the size of the system circuit.

Further, in the above-described aspect of the embodiment, a SCAN-DATA signal need not be limited to a 1 pulse signal, but rather can be a signal such that a High state and a Low state are repeated in a fixed cycle.

According to the present invention hereinabove, since one period adjusting flip-flop is added to the final stage of a SCAN circuit comprised in a system circuit constituting a semiconductor device (LSI), a SCAN operation period is extended by 1 clock cycle. In accordance therewith, a SCAN operation period can be easily adjusted without changing the program in an LSI design CAD tool (software), and a SCAN-DATA signal can be detected.

Further, since only one flip-flop constituting few basic cells is added, a SCAN operation period can be adjusted without restricting the size of a system circuit.

The scope of protection of the present invention is not limited to the above-described aspect of the embodiment, but rather extends to the inventions disclosed in the claims, and the equivalents thereof.

What is claimed is:

1. A semiconductor device test circuit system circuit for testing a system circuit on a semiconductor device, said semiconductor device test circuit comprising:

n number of test flip-flop circuits, each including a racing prevention circuit which cause at least one clock delay to output a test signal from a test signal output terminal ($S_O$) as distinguished from an output terminal Q; and an additional flip-flop circuit dedicated for testing, wherein said test flip-flop circuits constitute a portion of said system circuit, a test signal output terminal of a $k^{th}$ (k is 1 through n−1) test flip-flop circuit is connected to a test signal input terminal of the $(k+1)^{th}$ test flip-flop terminal, and the test signal outputted from the $n^{th}$ test flip-flop circuit is inputted to said additional flip-flop circuit and outputted from an output terminal Q of said additional flip-flop circuit within a testing period of n+1 clocks.

2. The semiconductor device test circuit according to claim 1, wherein said additional flip-flop circuit comprises at least a D flip-flop.

\* \* \* \* \*